(12) United States Patent
Fukushima et al.

(10) Patent No.: US 9,261,977 B2
(45) Date of Patent: Feb. 16, 2016

(54) ELECTRONIC CIRCUIT AND POSITION INDICATOR

(71) Applicant: Wacom, Co., Ltd., Saitama (JP)

(72) Inventors: Yasuyuki Fukushima, Saitama (JP); Hiroyuki Fujitsuka, Saitama (JP)

(73) Assignee: Wacom Co., Ltd., Saitama (JP)

( * ) Notice: Subject to any disclaimer, the term of this patent is extended or adjusted under 35 U.S.C. 154(b) by 371 days.

(21) Appl. No.: 13/923,226

(22) Filed: Jun. 20, 2013

(65) Prior Publication Data

US 2014/0043777 A1    Feb. 13, 2014

(30) Foreign Application Priority Data

Aug. 8, 2012   (JP) .................................. 2012-176021

(51) Int. Cl.
| | | |
|---|---|---|
| *H05K 1/16* | (2006.01) | |
| *G06F 3/033* | (2013.01) | |
| *G06F 3/041* | (2006.01) | |
| *G06F 3/044* | (2006.01) | |
| *G06F 3/0354* | (2013.01) | |

(52) U.S. Cl.
CPC ............ *G06F 3/033* (2013.01); *G06F 3/03545* (2013.01); *G06F 3/044* (2013.01); *G06F 3/0416* (2013.01); *H05K 1/162* (2013.01)

(58) Field of Classification Search
CPC ..... G06F 3/03545; G06F 3/044; H05K 1/162; H01L 27/13
USPC .......................................... 345/179; 361/782
See application file for complete search history.

(56) References Cited

U.S. PATENT DOCUMENTS

| | | | | | |
|---|---|---|---|---|---|
| 3,109,983 | A | * | 11/1963 | Cooper .................... | H01C 1/16 323/370 |
| 3,148,315 | A | * | 9/1964 | Rondeau ................ | H01G 4/015 361/273 |
| 3,602,770 | A | * | 8/1971 | McMahon ............... | H01H 9/54 307/104 |

(Continued)

FOREIGN PATENT DOCUMENTS

| | | |
|---|---|---|
| JP | 2002244806 A | 8/2002 |
| WO | 02/103622 A2 | 12/2002 |

OTHER PUBLICATIONS

Extended European Search Report dated Jul. 28, 2015, for corresponding EP Application No. 13179673.2-1972 / 2696266, 5 pages.

*Primary Examiner* — Adrian S Wilson
*Assistant Examiner* — Izak Baranowski
(74) *Attorney, Agent, or Firm* — Seed IP Law Group PLLC

(57) ABSTRACT

Disclosed herein is a position indicator that includes: an enclosure forming a hollow and rod-shaped tubular body; a substrate disposed in the hollow portion of the enclosure and having a circuit configured to process signals exchanged with a position detection sensor; and a film-shaped capacitor having first and second conductor layers. The first conductor layer is formed on one side of a sheet-shaped dielectric, and the second conductor layer is formed on another side of the sheet-shaped dielectric and is opposed to the first conductor layer with the sheet-shaped dielectric provided therebetween. The film-shaped capacitor is fastened to the substrate in such a manner as to make up part of said circuit, and the size of an area over which the first and second conductor layers of the film-shaped capacitor are opposed is changeable by changing the size of the film-shaped capacitor to specify a constant for said circuit.

19 Claims, 10 Drawing Sheets

(56) References Cited

U.S. PATENT DOCUMENTS

| | | | | |
|---|---|---|---|---|
| 5,206,785 A | * | 4/1993 | Hukashima | G01D 5/2417 361/283.2 |
| 5,576,502 A | * | 11/1996 | Fukushima | G06F 3/03545 178/19.01 |
| 5,619,431 A | * | 4/1997 | Oda | G06F 3/046 702/150 |
| 5,781,081 A | * | 7/1998 | Arakawa | H01P 1/20381 333/174 |
| 7,005,932 B2 | * | 2/2006 | Shih | H03B 5/1841 257/296 |
| 7,511,705 B2 | | 3/2009 | Silk et al. | |
| 7,667,975 B2 | * | 2/2010 | Kambara | H01G 2/06 174/261 |
| 8,243,033 B2 | | 8/2012 | Ely et al. | |
| 2004/0233178 A1 | | 11/2004 | Silk et al. | |
| 2005/0088799 A1 | * | 4/2005 | Kusabe | H01L 27/016 361/303 |
| 2009/0184940 A1 | | 7/2009 | Silk et al. | |

* cited by examiner

ELECTRONIC CIRCUIT AND POSITION INDICATOR

CROSS-REFERENCE TO RELATED APPLICATION

The present application claims priority under 35 U.S.C. 119(a) to Japanese Patent Application No. 2012-176021, filed Aug. 8, 2012, which is incorporated by reference herein.

BACKGROUND

1. Technical Field

The present invention relates to an electronic circuit such as time constant circuit or resonance circuit including a capacitor. Further, the present invention relates to a pen-shaped position detector used together with a coordinate input device.

2. Description of the Related Art

In an electronic circuit such as time constant circuit or resonance circuit including a capacitor, the capacitance of the capacitor is adjusted in an early stage for adjustment as a product. This adjustment is intended to set a time constant so as to provide constants unique to electronic equipment or set a resonance condition so as to match the resonance frequency with a unique frequency. At this time, the capacitance of the capacitor is adjusted, for example, using a trimmer capacitor.

On the other hand, an electromagnetic induction coordinate input device includes a sensor and pen-shaped position indicator as disclosed, for example, in Japanese Patent Laid-Open No. 2002-244806. The sensor includes a number of loop coils disposed in the directions of the x and y coordinate axes. The position indicator has a resonance circuit that includes a coil and capacitor. The coordinate input device detects the coordinates in the x- and y-axis directions of the position indicated by the position indicator based on electromagnetic induction taking place between the position indicator and sensor. The x- and y-axis directions are respectively the horizontal and vertical directions of the substrate on which the many loop coils are disposed, for example, in the sensor.

The resonance frequency of the resonance circuit of the position indicator is selected to ensure that the resonance circuit resonates with the frequency signal from the sensor. In related art, a trimmer capacitor including an adjuster adapted to adjust the capacitance thereof is used at least as part of the capacitor making up the resonance circuit for selecting the resonance frequency. This adjuster is manipulated to adjust the electrostatic capacitance of the trimmer capacitor to a desired resonance frequency.

Alternatively, a plurality of chip capacitors are provided in advance rather than using a trimmer capacitor. Of the plurality of chip capacitors, the number of the chip capacitors to be enabled is selected in such a manner that those chip capacitors to be disabled are disconnected from the circuit, thus achieving a predetermined resonance frequency.

BRIEF SUMMARY

Incidentally, a time constant circuit or resonance circuit of an electronic circuit used in electronic equipment are factory set as described above before shipment. During the factory setting, a trimmer capacitor has been used in related art as described above. However, electronic equipment such as mobile phone, PDA (Personal Digital Assistant) and tablet terminals have become increasingly small in recent years, making it necessary to reduce the ratio of the space occupied by the electronic circuit accommodated therein. Against this backdrop, the trimmer capacitor is relatively large, thus causing a hindrance to downsizing.

On the other hand, the above-described electromagnetic induction coordinate input device is finding wider application as a user interface means for compact mobile devices such as mobile phone terminals and pad-type personal computers. As for a position indicator used together with a coordinate input device for such compact electronic equipment, there is a demand for a thinner, pen-shaped position indicator.

For the position indicators in related art however, a relatively large trimmer capacitor has been used. Even if a plurality of chip capacitors are used, a large space is necessary for installation, thus causing hindrance to the use of a thin pen shape for the position indicator.

On the other hand, it is necessary to adjust each trimmer capacitor, thus making the adjustment time- and labor-consuming now as in the past.

It is desirable to provide a position indicator that solves the above problems.

According to an embodiment of the present invention, there is provided a position indicator that includes an enclosure, substrate and film-shaped capacitor. The enclosure forms a hollow and rod-shaped tubular body. The substrate is disposed in the hollow portion of the enclosure and has a circuit adapted to handle signals exchanged with a position detection sensor. The film-shaped capacitor has first and second conductor layers. The first conductor layer is formed on one (first) side of a sheet-shaped dielectric. The second conductor layer is formed on a (second) side of the sheet-shaped dielectric opposed to the one (first) side and is opposed to the first conductor layer with the sheet-shaped dielectric provided therebetween.

The film-shaped capacitor is fastened to and disposed on the substrate in such a manner as to make up part of the circuit. The size of an area over which the first and second conductor layers of the film-shaped capacitor are opposed to each other is changed by changing the size of the film-shaped capacitor so as to specify constants of the circuit disposed on the substrate.

In the invention configured as described above, the film-shaped capacitor is fastened to the substrate in such a manner as to make up part of the circuit. Then, the size of the film-shaped capacitor is changed, for example, by cutting it with scissors or removing the pattern thereof by laser trimming, thus changing the size of the area over which the first and second conductor layers are opposed to each other. As a result, the capacitance of the film-shaped capacitor is changed, thus specifying the constants of the circuit such as the resonance frequency thereof.

The position indicator according to the present invention uses a film-shaped capacitor whose size can be changed by cutting it. Therefore, accommodating the film-shaped capacitor in the hollow portion of the rod-shaped tubular body makes it possible to readily find application in a thin pen-shaped position indicator.

In the present invention, a film-shaped capacitor is used to specify constants of a circuit such as resonance frequency. As a result, it is possible to readily specify the circuit constants by changing the size of the film-shaped capacitor, for example, by cutting it. Then, the film-shaped capacitor can be readily accommodated in the hollow portion of a rod-shaped tubular body, providing a thin pen-shaped position indicator with ease.

DETAILED DESCRIPTION

First Embodiment

Figure 1A:
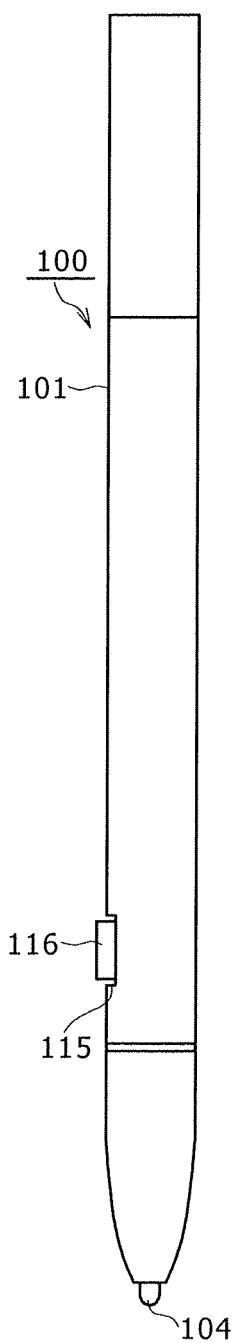
FIGS. 1A and 1B are diagrams illustrating a configuration example of an embodiment of a position indicator according to the present invention.
Figure 1B:
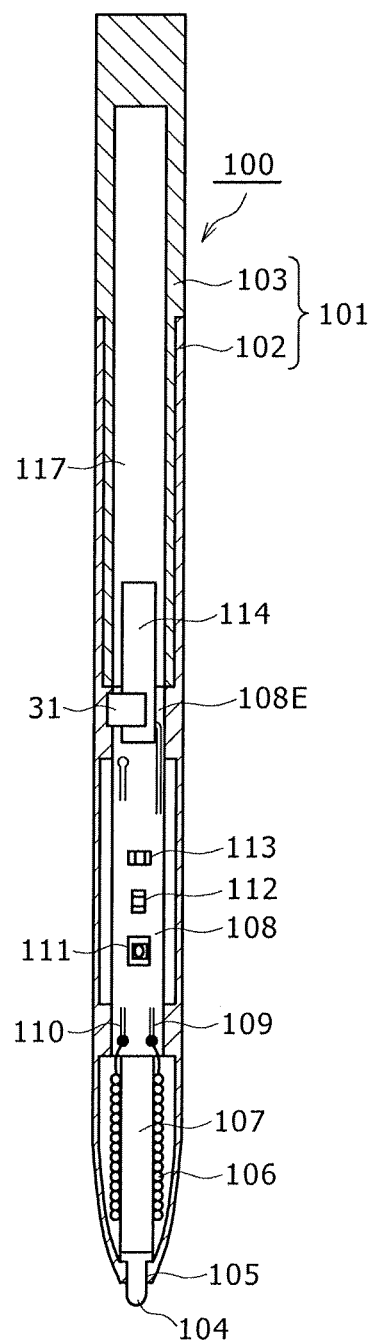
Figure 2:
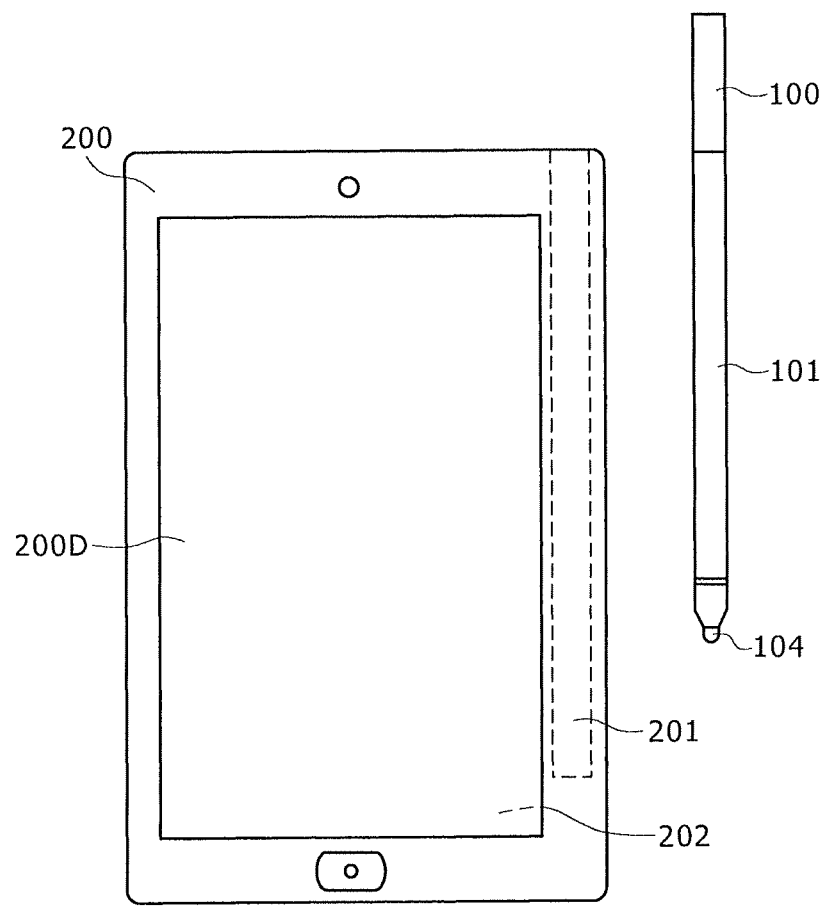
FIG. 2 is a diagram illustrating an example of electronic equipment used in an embodiment of the position indicator according to the present invention.

FIGS. 1A and 1B are diagrams for describing a first embodiment of a position indicator according to the present invention. Further, FIG. 2 illustrates an example of electronic equipment 200 using a position indicator 100 according to the first embodiment. In this example, the electronic equipment 200 is an intelligent mobile phone terminal including a display screen 200D of a display device such as LCD (Liquid Crystal Display). The electronic equipment 200 has an electromagnetic induction position detector 202 on the back of the display screen 200D.

Then, the enclosure of the electronic equipment 200 in this example has a concave accommodation hole 201 adapted to accommodate a pen-shaped position indicator 100. The user takes the position indicator 100 out of the concave accommodation hole 201 of the electronic equipment 200 as necessary to perform a position indication operation on the display screen 200D.

When a position indication operation is performed on the display screen 200D of the electronic equipment 200 with the pen-shaped position indicator 100, the position detector 202 provided on the back of the display screen 200D detects not only the position where the position indicator 100 was operated but also the writing pressure. The microcomputer provided in the position detector 202 of the electronic equipment 200 performs a display process appropriate to the operation position on the display screen 200D and the writing pressure.

FIG. 1A illustrates an overall outline of the position indicator 100 according to the present embodiment. Further, FIG. 1B is a vertical sectional view of the position indicator 100 according to the present embodiment.

As illustrated in FIGS. 1A and 1B, the position indicator 100 has a case 101 that is long and narrow along the axial center and makes up a bottomed cylindrical enclosure in which one of ends thereof is closed. This case 101 includes first and second cases 102 and 103 made, for example, of resin as illustrated in FIG. 1B. The first and second cases 102 and 103 are assembled in a concentric manner. In this case, the two cases are assembled and joined together in such a manner that the second case 103 is located on the inside of the first case 102 as illustrated in FIG. 1B.

One axial end of the first case 102 is the pen tip side of the pen-shaped position indicator. A through hole 105 is provided on the pen tip side of the first case 102. The protruding member (pen tip member) 104 protrudes externally through the through hole 105.

Then, the protruding member 104 is accommodated on the pen tip side of the first case 102 of the case 101 of the position indicator 100 in such a manner that part thereof protrudes via the through hole 105 as illustrated in FIG. 1B. Then, a ferrite core 107 as an example of a magnetic material is disposed on the side opposite to the protruding side of the protruding member 104. A position indication coil 106 as an example of an inductance element is wound around the ferrite core 107. The ferrite core 107 is in the shape of a circular cylinder.

Then, a long, narrow and rectangular printed wiring board 108 is disposed in the first case 102 on the side opposite to the pen tip side of the ferrite core 107 having the position indication coil 106 wound therearound. The printed wiring board 108 is less wide than the inner diameter of the first case 102. One and other ends of the position indication coil 106 are, for example, soldered to conductor patterns 109 and 110 formed on the printed wiring board 108, respectively.

The printed wiring board 108 has not only a push switch 111 but also capacitors 112 and 113 and a film-shaped capacitor 114. The push switch 111 turns on when pressed down and turns off when released. The capacitors 112 and 113 make up a resonance circuit together with the position indication coil 106. Further, on the printed wiring board 108, a conductor pattern (not shown in FIG. 1B) is formed, the capacitor 112 and film-shaped capacitor 114 are connected in parallel with the position indication coil 106, and the capacitor 113 and push switch 111 are connected in series. The series circuit of the capacitor 113 and push switch 111 is connected in parallel with the position indication coil 106.

Then, in this example, a through hole 115 is provided at the position of the side peripheral surface of the case 101 (first case 102) of the position indicator 100 matching the position of the push switch 111. A press-down operator 116 is attached to the case 101 in such a manner that the push switch 111 can be pressed down in the through hole 115. In this case, a given function is assigned to the pressing-down of the push switch 111 using the press-down operator 116. This assignment of a given function is conducted on the electronic equipment 200 having the position detector 202. For example, the pressing-down of the push switch 111 using the press-down operator 116 is assigned, in the electronic equipment 200 shown in this example, an operation similar to clicking of a pointing device such as a mouse.

The capacitors 112 and 113 making up part of the resonance circuit are disposed on the printed wiring board 108 as chip components in this example. On the other hand, the film-shaped capacitor 114 making up part of the resonance circuit is a sheet-shaped capacitor configured as described later and disposed on the printed wiring board 108 as described later. Then, in the present embodiment, the size of the film-shaped capacitor 114, and the longitudinal length thereof in this example, can be changed as described later, thus adjusting the capacitance thereof and consequently the resonance frequency of the resonance circuit.

It should be noted that the printed wiring board 108 is held by the inner wall surface of the first case 102. Then, the side opposite to the pen tip side of the printed wiring board 108 is a hollow space 117 in the first case 102. The majority of the film-shaped capacitor 114 is located in the hollow space 117 as described later.

Circuit Configuration for Position Detection in the Electronic Equipment 200

Figure 3:
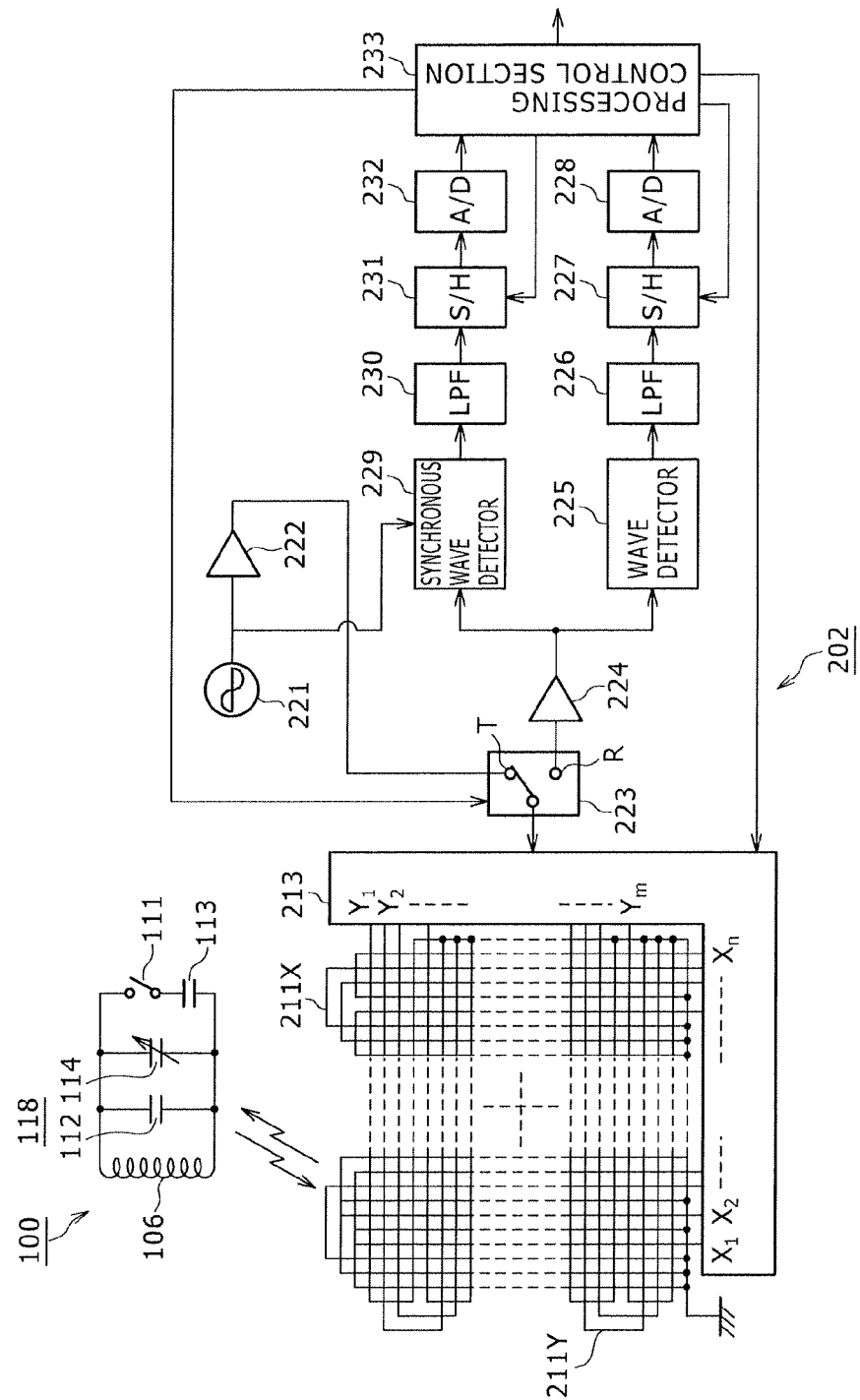
FIG. 3 is a circuit diagram for describing an embodiment of the position indicator according to the present invention and a position detector.

A description will be given next of an example of circuit configuration of the position detector 202 of the electronic equipment 200 adapted to detect not only the indicated position but also the writing pressure using the position indicator 100 according to the present embodiment with reference to FIG. 3. FIG. 3 is a block diagram illustrating examples of circuit configurations of the position indicator 100 and the position detector 202 of the electronic equipment 200.

The position indicator 100 includes a resonance circuit 118 as described earlier. The resonance circuit 118 includes, as illustrated in FIG. 3, the position indication coil 106, capacitor 112, film-shaped capacitor 114, push switch 111 and capacitor 113. The position indication coil 106 is an inductance element. The capacitor 112 includes a chip component. The position indication coil 106, capacitor 112 and film-shaped capacitor 114 are connected in parallel with each other. The series circuit made up of the push switch 111 and capacitor 113 is further connected in parallel with the position indication coil 106, capacitor 112 and film-shaped capacitor 114.

In this case, the connection of the capacitor 113 with the parallel resonance circuit 118 is controlled in response to the turning on and off of the push switch 111, thus changing the resonance frequency. The position detector 202 detects the change in frequency by detecting the change in phase of the signal supplied from the position indicator 100 as described later, thus detecting whether or not the push switch 111 has been pressed.

The position detector 202 of the electronic equipment 200 has a position detection coil formed therein. The position detection coil includes an x-direction loop coil group 211X and y-direction loop coil group 211Y that are stacked one on top of the other. The loop coil groups 211X and 211Y include, for example, n and m rectangular loop coils, respectively. The loop coils making up the loop coil groups 211X and 211Y are arranged side by side at equal spacings in such a manner as to sequentially overlap each other.

Further, the position detector 202 has a selection circuit 213 to which the x-direction loop coil group 211X and y-direction loop coil group 211Y are connected. The selection circuit 213 sequentially selects one of the two loop coil groups 211X and 211Y.

Further, the position detector 202 includes an oscillator 221, current driver 222, destination switching circuit 223, reception amplifier 224, wave detector 225, low-pass filter 226, sample/hold circuit 227, A/D conversion circuit 228, synchronous wave detector 229, low-pass filter 230, sample/hold circuit 231, ND conversion circuit 232 and processing control section 233. The processing control section 233 includes a microcomputer.

The oscillator 221 generates an alternating current (AC) signal at a frequency f0. Then, the oscillator 221 supplies the generated AC signal to the current drive 222 and synchronous wave detector 229. The current driver 222 converts the AC signal, supplied from the oscillator 221, into a current, transmitting the current to the destination switching circuit 223. The destination switching circuit 223 switches between destinations (transmitting terminal T and receiving terminal R) to which the loop coil selected by the selection circuit 213 is connected under control of the processing control section 233. Of these destinations, the current driver 222 is connected to the transmitting terminal T, and the reception amplifier 224 to the receiving terminal R.

The induction voltage generated in the loop coil selected by the selection circuit 213 is supplied to the reception amplifier 224 via the selection circuit 213 and destination switching circuit 223. The reception amplifier 224 amplifies the induction voltage supplied from the loop coil, transmitting the amplified induction voltage to the wave detector 225 and synchronous wave detector 229.

The wave detector 225 detects the induction voltage generated in the loop coil, i.e., the reception signal, transmitting the signal to the low-pass filter 226. The low-pass filter 226 has a cutoff frequency sufficiently lower than the frequency f0 described above, converting the output signal of the wave detector 225 into a direct current (DC) signal and transmitting the DC signal to the sample/hold circuit 227. The sample/hold circuit 227 holds the voltage level of the output signal of the low-pass filter 226 at a predetermined timing, and more specifically, at a predetermined timing during the reception period, transmitting the voltage level to the A/D (Analog to Digital) conversion circuit 228. The A/D conversion circuit 228 converts the analog output of the sample/hold circuit 227 into a digital signal, outputting the signal to the processing control section 233.

On the other hand, the synchronous wave detector 229 synchronously detects the output signal of the reception amplifier 224 with the AC signal from the oscillator 221, transmitting a signal whose level corresponds to the phase difference between the two signals to the low-pass filter 230. The low-pass filter 230 has a cutoff frequency sufficiently lower than the frequency f0, converting the output signal of the synchronous wave detector 229 into a DC signal and transmitting the DC signal to the sample/hold circuit 231. The sample/hold circuit 231 holds the voltage level of the output signal of the low-pass filter 230 at a predetermined timing, transmitting the voltage level to the A/D (Analog to Digital) conversion circuit 232. The ND conversion circuit 232 converts the analog output of the sample/hold circuit 231 into a digital signal, outputting the digital signal to the processing control section 233.

The processing control section 233 controls the respective sections of the position detector 202. That is, the processing control section 233 controls the selection of a loop coil by the selection circuit 213, the switching by the destination switching circuit 223 and the timings of the sample/hold circuits 227 and 231. The processing control section 233 transmits radio waves from the x-direction loop coil group 211X and y-direction loop coil group 211Y for a given transmission continuation time based on the input signals from the ND conversion circuits 228 and 232.

An induction voltage is generated in each of the loop coils of the x-direction loop coil group 211X and y-direction loop coil group 211Y by radio waves transmitted from the position indicator 100. The processing control section 233 calculates the x- and y-axis coordinates of the position indicated by the position indicator 100 based on the level of the induction voltage generated in each of the loop coils. Further, the processing control section 233 detects whether or not the push switch 111 has been pressed down based on the signal level that corresponds to the phase difference between the transmitted and received radio waves.

As described above, the position detector 202 can detect the position of the position indicator 100 that has approached the position detector 202 using the processing control section 233. Moreover, it is possible to detect whether or not the press-down operator 116 of the position indicator 100 has been pressed down by detecting the phase (frequency shift) of the received signal.

Figure 4A:
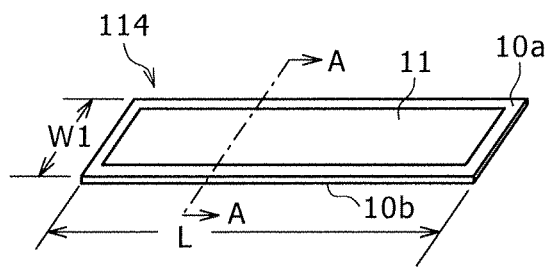
FIGS. 4A and 4B are diagrams for describing a configuration example of a film-shaped capacitor used in a first embodiment of the position indicator according to the present invention.
Figure 4B:
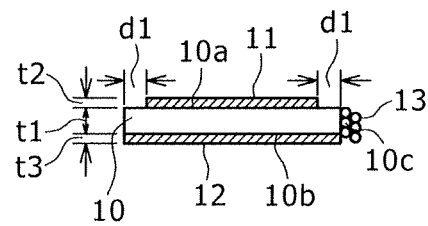

Configuration Example of the Film-Shaped Capacitor 114: FIGS. 4A and 4B

FIGS. 4A and 4B are diagrams illustrating a configuration example of the film-shaped capacitor 114 used in the position indicator 100 in the first embodiment. FIG. 4A is an appearance configuration diagram, and FIG. 4B is an enlarged view of the cross section along a line A-A in FIG. 4A.

In the film-shaped capacitor 114, conductor layers 11 and 12 are formed, respectively, on one (first) side 10a of a rectangular and sheet-shaped dielectric 10 (hereinafter referred to as the dielectric sheet 10) and other (second) side 10b thereof in such a manner as to be opposed to each other. The dielectric sheet 10 has a thickness t1 which is, for example, 12 to 25 µm. The conductor layers 11 and 12 are opposed to each other with the dielectric sheet 10 provided therebetween. The conductor layers 11 and 12 make up one and other electrodes of the film-shaped capacitor 114. In this example, the dielectric sheet 10 making up the film-shaped capacitor 114 is in the shape of a belt having, for example, a width W1 of 2 to 3 mm and a longitudinal length L of 15 mm.

The dielectric sheet 10 is made, for example, of a dielectric material such as polyester, polyamide or polyimide. The dielectric sheet which will be described later is configured in the same manner. On the other hand, the conductor layers 11 and 12 are formed by vacuum-depositing a conductor material made, for example, of aluminum or nickel chromium on the dielectric sheet 10. Thicknesses t2 and t3 of the conductor layers 11 and 12 are, for example, about 1000 Å. The conductor layers which will be described later are formed to the same thickness.

In this example, the conductor layer 11 formed on the one side 10a of the dielectric sheet 10 is formed inward at a distance d1 or more from the edge of the dielectric sheet 10. In this example, on the other hand, the conductor layer 12 is formed across the entire surface of the other side 10b of the dielectric sheet 10, and even over the edge thereof.

The conductor layer 11 is formed in such a manner as not to spread over the edge of the dielectric sheet 10 as described above so as to ensure that the capacitance of the film-shaped capacitor 114 remains unchanged. That is, if both the conductor layers 11 and 12 are formed to spread over the edge of the dielectric sheet 10, it is likely, in the event of adhesion of water droplets 13 to an edge surface 10c along the thickness of the dielectric sheet 10 due to humidity, that the conductor layers 11 and 12 may be connected together via the water droplets 13 as illustrated schematically in FIG. 4B. The dielectric constant of water is more than 80 times that of air. Therefore, the capacitance of the film-shaped capacitor 114 is significantly different between when the water droplets 13 adhere to the edge surface 10c and when they do not.

In contrast, if the conductor layer 11 is formed at the distance d1 inward from the edge of the dielectric sheet 10, the conductor layers 11 and 12 are not connected together via the water droplets 13 even in the event of adhesion thereof, thus keeping the change in capacitance of the film-shaped capacitor 114 to a minimum. It should be noted that the distance d1 should preferably be, for example, 0.2 mm or more.

It should be noted that, to take the above countermeasure against humidity, at least one of the one and other sides 10a and 10b of the dielectric sheet 10 need only be formed at the distance d1 or more inward from the edge of the dielectric sheet 10. However, if both of the conductor layers 11 and 12 on the one and other sides 10a and 10b of the dielectric sheet 10 are formed at the distance d1 or more inward from the edge of the dielectric sheet 10, it is possible to further reduce the change in capacitance due to humidity.

Figure 5A:
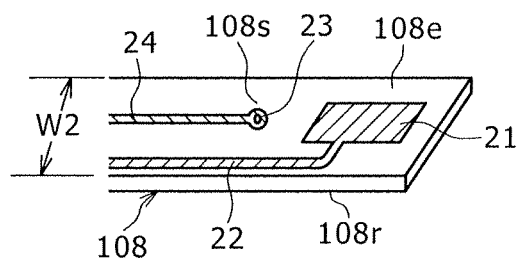
FIGS. 5A and 5B are diagrams for describing a configuration example of main components of a printed wiring board used in the first embodiment of the position indicator according to the present invention.
Figure 5B:
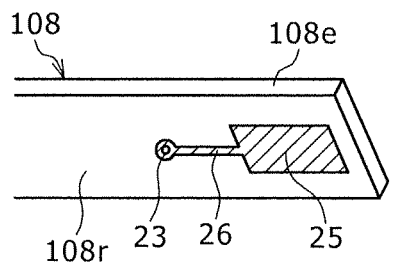

Examples of Fastening the Film-Shaped Capacitor 114 to the Printed Wiring Board 108: FIGS. 5A to 6B FIGS. 5A and 5B are diagrams for describing a configuration example of the portion of the printed wiring board 108 to which the film-shaped capacitor 114 is attached. In this example, the printed wiring board 108 is long, narrow and rectangular with a width W2 of, for example, 2 to 3 mm. Then, the film-shaped capacitor 114 is fastened to an end portion 108e on the side opposite to the pen tip side of the printed wiring board 108. FIGS. 5A and 5B illustrate a configuration example of conductor patterns provided on the end portion 108e of the printed wiring board 108.

That is, a rectangular land pattern 21 and conductor pattern 22 are formed on one side (front side) 108s of the end portion 108e of the printed wiring board 108 as illustrated in FIG. 5A. The conductor pattern 22 is continuously connected to the land pattern 21. Further, a through hole 23 and conductor pattern 24 are also formed. The conductor pattern 24 is connected to the through hole 23. Still further, a rectangular land pattern 25 and conductor pattern 26 are formed on the other side (rear side) 108r of the end portion 108e of the printed wiring board 108 as illustrated in FIG. 5B. The land pattern 25 is provided at a position opposed to the land pattern 21. The conductor pattern 26 connects the land pattern 25 and through hole 23 together.

The land pattern 21 on the front side 108s of the printed wiring board 108 is electrically connected to the conductor pattern 109 (FIG. 1B) via the conductor pattern 22. One end of the position indication coil 106 is connected to the conductor pattern 109. Further, the land pattern 25 on the rear side 108r of the printed wiring board 108 is electrically connected to the conductor pattern 110 via the conductor pattern 26, through hole 23 and conductor pattern 24. The other end of the position indication coil 106 is connected to the conductor pattern 110.

Figure 6A:
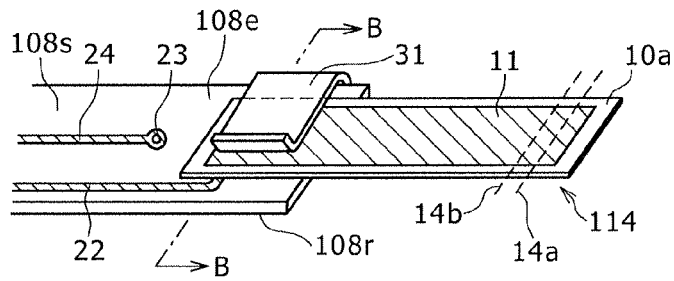
FIGS. 6A and 6B are diagrams for describing main components of the first embodiment of the position indicator according to the present invention.
Figure 6B:
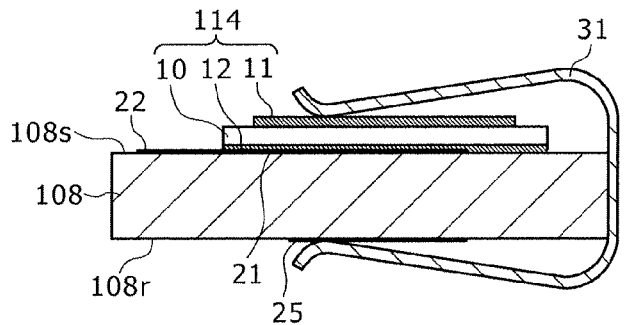

Then, in this example, one longitudinal end of the film-shaped capacitor 114 is fastened and attached to the front side 108s of the end portion 108e of the printed wiring board 108 with a crimping clip 31 made of a conductive material such as conductive metal as illustrated in FIG. 6A. That is, the one end of the film-shaped capacitor 114 and the printed wiring board 108 are crimped and sandwiched by the crimping clip 31 as illustrated in FIG. 6B, i.e., an enlarged view of the cross section along line B-B in FIG. 6A. At this time, the longitudinal other end of the film-shaped capacitor 114 is left free as illustrated in FIG. 6A. It should be noted that the longitudinal one end of the film-shaped capacitor 114 and the printed wiring board 108 may be further bonded together with a conductive adhesive.

Then, in the case of this example, the conductor layer 12 on the other side 10b of the dielectric sheet 10 of the film-shaped capacitor 114 is brought into contact with the land pattern 21 on the front side 108s of the printed wiring board 108 for electrical connection as illustrated in FIGS. 6A and 6B. On the other hand, the conductor layer 11 on the one side 10a of the dielectric sheet 10 of the film-shaped capacitor 114 is electrically connected to the land pattern 25 on the rear side 108r of the printed wiring board 108 via the crimping clip 31 made of a conductive metal.

Therefore, the conductor layers 11 and 12, i.e., the one and other electrodes of the film-shaped capacitor 114, are respectively connected to one and other end portions of the position indication coil 106, thus allowing the film-shaped capacitor 114 to be connected in parallel with the position indication coil 106.

Then, after the film-shaped capacitor 114 is fastened to the end portion 108e of the printed wiring board 108, the longitudinal other end of the film-shaped capacitor 114, i.e., a free end thereof, is cut, for example, with scissors in a direction orthogonal to the longitudinal direction as shown by dotted cutting lines 14a and 14b in FIG. 6A, thus changing the size of the area over which the conductor layers 11 and 12 are opposed to each other, varying the capacitance of the film-shaped capacitor 114 and adjusting the resonance frequency of the resonance circuit 118 to a desired one. It should be noted that although the size of the area over which the conductor layers 11 and 12 are opposed to each other is changed by cutting the film-shaped capacitor 114 in the above description, it is possible to change the size of the area by cutting only the conductor layer 11 to a predetermined size of area by laser trimming.

In this case, when the film-shaped capacitor 114 is cut, the conductor layer 11 is located at the same position as the edge of the dielectric sheet 10 at the cut portion of the film-shaped capacitor 114. This leads to variation of the capacitance as caused by the adhesion of water droplets described above. However, the cut surface of the film-shaped capacitor 114 is along the short sides thereof, and therefore about 2 mm, which is short as described above. As a result, the impact thereof is small.

The above first embodiment permits adjustment of the resonance frequency of the resonance circuit by using the film-shaped capacitor 114 as a capacitor adapted to adjust the resonance frequency, and by cutting the film-shaped capacitor 114 fastened to the printed wiring board 108 so as to change the size thereof and to change the size of the area over which the conductor layers 11 and 12 are opposed to each other. This eliminates the need to provide a trimmer capacitor and a plurality of capacitors on a printed wiring board as in related art. At the same time, the film-shaped capacitor can be sized to be accommodated in the hollow portion within the case 101 of the position indicator 100, thus providing the thin pen-shaped position indicator 100 with ease.

Further, in the above first embodiment, the film-shaped capacitor is fastened to the printed wiring board 108 with the crimping clip 31 made of a conductive material. This eliminates the need for soldering, thus making it possible to use a heat-sensitive material as the dielectric sheet 10 of the film-shaped capacitor 114.

Figure 7A:
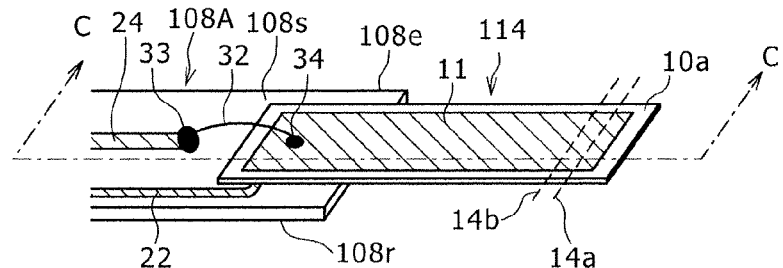
FIGS. 7A and 7B are diagrams for describing main components of a second embodiment of the position indicator according to the present invention.
Figure 7B:
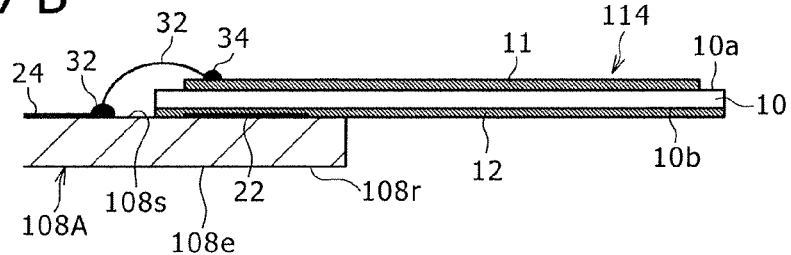

Second Embodiment: FIGS. 7A and 7B

This second embodiment is an example in which the film-shaped capacitor is fastened to the printed wiring board without using a crimping clip. In a second embodiment, the film-shaped capacitor 114 described in the first embodiment can be used in an 'as-is' fashion. In the second embodiment, however, the dielectric sheet 10 is made of a heat-resistant material such as polyimide. The film-shaped capacitor 114 is configured in exactly the same manner as that in the first embodiment in all other respects.

FIGS. 7A and 7B are diagrams illustrating an example of fastening the film-shaped capacitor 114 to a printed wiring board in the second embodiment. A printed wiring board 108A in the second embodiment is configured in exactly the same manner as the printed wiring board 108 in the first embodiment except for the conductor patterns of the end portion 108e. Then, the position indicator in the second embodiment is configured in exactly the same manner as the position indicator 100 in the first embodiment except for the configuration of the portion where the film-shaped capacitor 114 is fastened to the printed wiring board 108A. In the description of the second embodiment, therefore, the components identical to those of the position indicator 100 in the first embodiment are denoted by the same reference numerals.

FIG. 7A is a perspective view illustrating the manner in which the film-shaped capacitor 114 is attached to the end portion 108e of the printed wiring board 108A. FIG. 7B is a cross sectional view along line C-C in FIG. 7A.

In the end portion 108e of the printed wiring board 108A according to the second embodiment, as illustrated in FIG. 7B, the land pattern 21 and conductor patterns 22 and 24 are formed only on the front side 108s. However, the through hole 23 on the front side 108s and the land pattern 25 and conductor pattern 26 on the rear side 108r provided in the first embodiment are not formed.

Then, as illustrated in FIGS. 7A and 7B, the film-shaped capacitor 114 is bonded at its one end to the end portion 108e of the printed wiring board 108A with a conductive adhesive which is not shown. In this case, the conductor layer 12 formed on the other side 10b of the dielectric sheet 10 of the film-shaped capacitor 114 is brought into contact with the land pattern 21 formed on the front side 108s of the printed wiring board 108A for electrical connection as in the first embodiment. Therefore, the conductor layer 12 of the film-shaped capacitor 114 is connected to the one end of the position indication coil 106 via the conductor pattern 22 that is continuously connected to the land pattern 21.

Then, in the second embodiment, the conductor pattern 24 formed on the front side 108s of the printed wiring board 108A and connected to the other end of the position indication coil 106 is wire-bonded to the conductor layer 11 formed on the one side 10a of the dielectric sheet 10 of the film-shaped capacitor 114 with a gold wire 32 for electrical connection. It should be noted that the gold wire 32 is connected to the conductor pattern 24 with a solder 33 and to the conductor layer 11 of the film-shaped capacitor 114 with a solder 34 as illustrated in FIGS. 7A and 7B.

In the second embodiment as in the first embodiment, the free end of the film-shaped capacitor 114 fastened to the printed wiring board 108A is cut, for example, with scissors as shown by the dotted cutting lines 14a and 14b in FIG. 7A, thus changing the size of the area over which the conductor layers 11 and 12 are opposed to each other and adjusting the resonance frequency of the resonance circuit 118 to a desired one.

The second embodiment allows to connect the film-shaped capacitor 114 and printed wiring board 108A only on the front side 108s of the printed wiring board 108A, thus ensuring ease in connection and fastening tasks.

Third Embodiment: FIGS. 8A to 9B

A third embodiment is exactly the same as the first embodiment except for the configuration of the end portion 108e of the printed wiring board 108 and that of the film-shaped capacitor 114 in the first embodiment. In the description of the third embodiment, the components identical to those of the first embodiment are denoted by the same reference numerals.

Figure 8A:
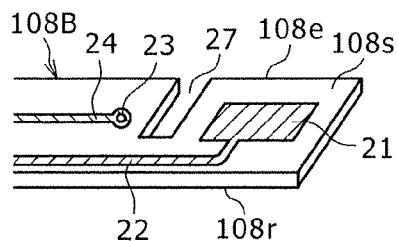
FIGS. 8A to 8D are diagrams for describing a configuration example of the film-shaped capacitor used in a third embodiment of the position indicator according to the present invention.
Figure 8C:
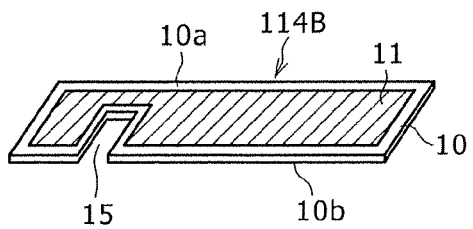
Figure 8B:
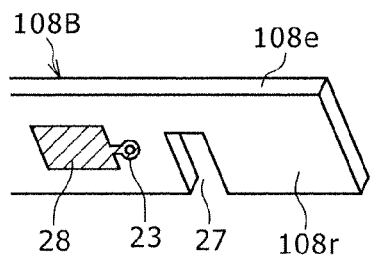
Figure 8D:
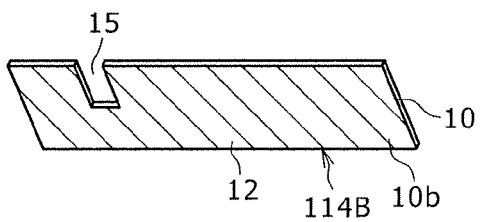
Figure 9A:
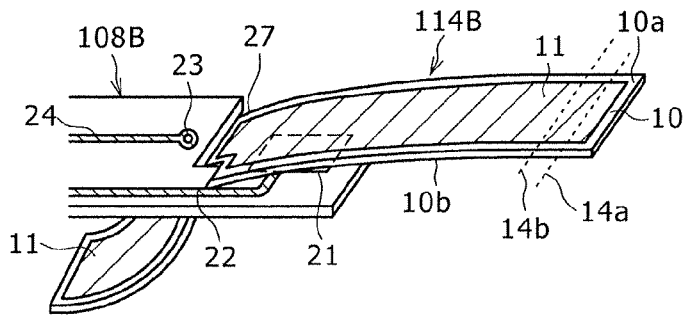
FIGS. 9A and 9B are diagrams for describing main components of the third embodiment of the position indicator according to the present invention.
Figure 9B:
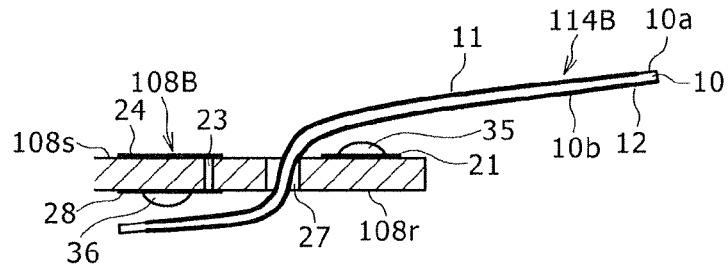

FIGS. 8A and 8B illustrate a configuration example of the end portion 108e of a printed wiring board 108B in the position indicator in the third embodiment. Further, FIGS. 8C and 8D illustrate a configuration example of a film-shaped capacitor 114B in the third embodiment. Still further, FIG. 9A is a diagram for describing an example of how the film-shaped capacitor 114B is attached to the printed wiring board 108B in the third embodiment, and FIG. 9B is a vertical cross-sectional view of FIG. 9A.

In the printed wiring board 108B of the third embodiment, as shown in FIGS. 8A and 8B, similarly to the first embodiment, the land pattern 21 and conductor patterns 22 and 24 are formed on the front side 108s. The conductor pattern 22 is continuously connected to the land pattern 21 and to the one end of the position indication coil 106. The conductor pattern 24 is connected to the through hole 23 and to the other end of the position indication coil 106.

Then, a notched groove 27 having a predetermined length is formed along the width (short sides) of the printed wiring board 108B between the land pattern 21 and through hole 23 in the end portion 108e of the printed wiring board 108B.

Further, a land pattern 28 is formed on the rear side 108r of the printed wiring board 108B. The land pattern 28 is connected to the through hole 23. Unlike the land pattern 25 in the first embodiment, the land pattern 28 is formed more toward the pen tip side than the notched groove 27 instead of being formed at the position opposed to the land pattern 21.

In the film-shaped capacitor 114B according to the third embodiment, the conductor layer 11 is formed on the one side 10a of the dielectric sheet 10, and the conductor layer 12 is formed on the other side 10b thereof as in the first embodiment as illustrated in FIGS. 8C and 8D. It should be noted, however, that a notched groove 15 having a predetermined length is formed along the width (short sides) of the film-shaped capacitor 114B according to the third embodiment at the one end of the film-shaped capacitor 114B that is connected to the end portion 108e of the printed wiring board 108B.

Then, in the third embodiment, the notched groove 27 of the printed wiring board 108B is brought into engagement with the notched groove 15 of the film-shaped capacitor 114B as illustrated in FIGS. 9A and 9B, after which the printed wiring board 108B and the film-shaped capacitor 114B are assembled together in such a manner that the two intersect each other.

Then, as illustrated in FIG. 9B, conductive adhesives 35 and 36 are applied respectively to two land patterns, i.e., the land pattern 21 located more toward the edge side of the end portion 108e than the notched groove 27 on the front side 108s of the printed wiring board 108B, and the land pattern 28 located more toward the pen tip side than the notched groove 27 on the rear side 108r of the printed wiring board 108B.

Further, the film-shaped capacitor 114B is bent into the form of letter S, thus bonding and fastening the film-shaped capacitor 114B to the printed wiring board 108B with the adhesives 35 and 36.

In the case of the example shown in FIGS. 9A and 9B, as for the portion of the film-shaped capacitor 114B located more toward the pen tip end than the notched groove 15, the conductor layer 11 formed on the one side 10a of the dielectric sheet 10 is bonded to the land pattern 28 of the printed wiring board 108B with the conductive adhesive 36 for electrical connection. As for the portion of the film-shaped capacitor 114B located more toward the other end (free end) than the notched groove 15, the conductor layer 12 formed on the other side 10b of the dielectric sheet 10 is bonded and electrically connected to the land pattern 21 of the printed wiring board 108B with the conductive adhesive 35.

In the third embodiment, therefore, the film-shaped capacitor 114B is also connected in parallel with the position indication coil 106. Then, in the third embodiment, the free end of the film-shaped capacitor 114B is also cut, for example, with scissors in a direction orthogonal to the longitudinal direction as shown by the dotted cutting lines 14a and 14b in FIG. 9A, thus changing the capacitance of the film-shaped capacitor 114 and adjusting the resonance frequency of the resonance circuit 118 to a desired one.

Fourth Embodiment: FIGS. 10A to 12C

In the first to third embodiments described above, when the push switch 111 is off, the resonance frequency of the resonance circuit 118 of the position indicator 100 is adjusted using the film-shaped capacitor 114.

However, it is also necessary to adjust the resonance frequency of the resonance circuit 118 when the push switch 111 is on. In a fourth embodiment, the capacitor 113 connected in series with the push switch 111 also includes a film-shaped capacitor, thus making it possible to independently adjust the resonance frequency of the resonance circuit 118 not only when the push switch 111 is off but also when it is on.

The fourth embodiment is exactly the same as the first embodiment except for the configuration of the end portion 108e of the printed wiring board 108 and that of the film-shaped capacitor in the first embodiment. In the description of the fourth embodiment, the components identical to those of the first embodiment are denoted by the same reference numerals.

Figure 10A:
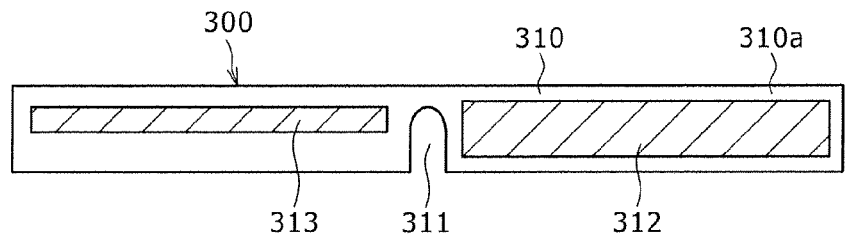
FIGS. 10A and 10B are diagrams for describing a configuration example of the film-shaped capacitor used in a fourth embodiment of the position indicator according to the present invention.
Figure 10B:
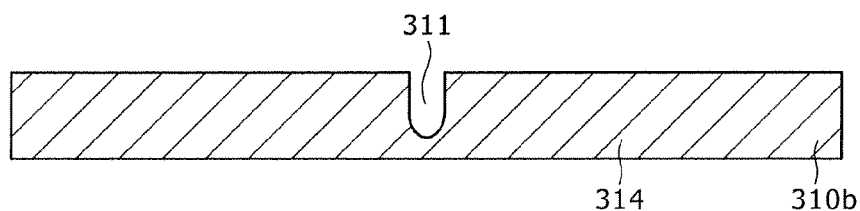
Figure 11A:
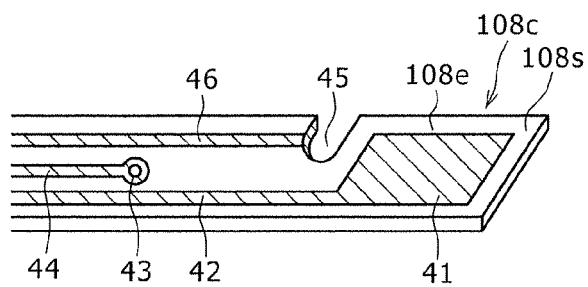
FIGS. 11A and 11B are diagrams for describing main components of the fourth embodiment of the position indicator according to the present invention.
Figure 11B:
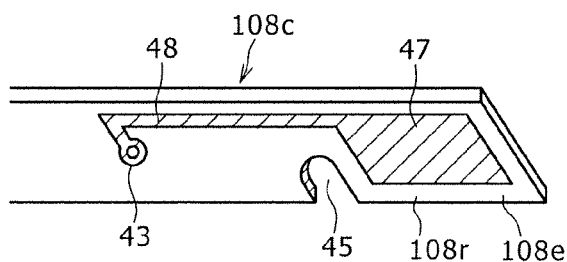
Figure 12A:
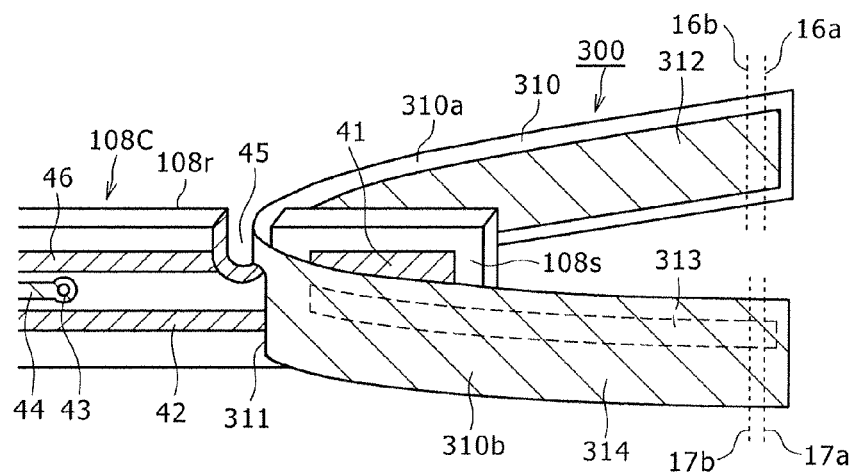
FIGS. 12A to 12C are diagrams for describing main components of the fourth embodiment of the position indicator according to the present invention.
Figure 12B:
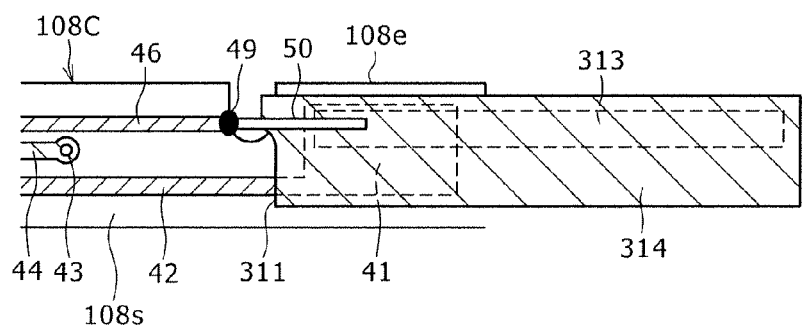
Figure 12C:
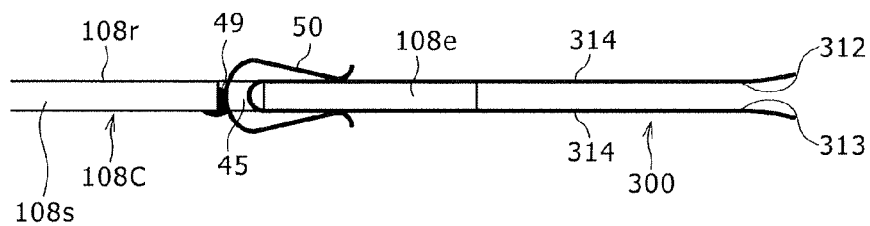

FIGS. 10A and 10B are diagrams illustrating a configuration example of a film-shaped capacitor 300 in the fourth embodiment. Further, FIGS. 11A and 11B illustrate a configuration example of the end portion 108e of a printed wiring board 108C in the fourth embodiment. Still further, FIGS. 12A to 12C are diagrams for describing an example of how the film-shaped capacitor 300 is attached to the printed wiring board 108C in the fourth embodiment.

The film-shaped capacitor 300 according to the fourth embodiment has a notched groove 311 roughly at the longitudinal center of a long, narrow and rectangular dielectric sheet 310 as illustrated in FIGS. 10A and 10B. The notched groove 311 has a predetermined length along the width (short sides) of the dielectric sheet 310.

Then, first and second conductor layers 312 and 313 are formed on one (surface) side 310a of the dielectric sheet 310, each on one of the two sides of the notched groove 311 in the longitudinal direction of the dielectric sheet 310 as illustrated in FIG. 10A. The conductor layers 312 and 313 are not electrically connected and are independent from each other. The first and second conductor layers 312 and 313 are formed at the distance d1 or more inward from the edge of the dielectric sheet 310 as a countermeasure against humidity as described in the first embodiment. Further, a third conductor layer 314 is formed across the entire surface of other (surface) side 310*b* of the dielectric sheet 310.

The dielectric sheet 310 and conductor layers 312 to 314 are configured in the same manner as the dielectric sheet 10 and conductor layers 11 and 12 in the first embodiment.

In the above configuration, the conductor layers 312 and 314 are opposed to each other with the dielectric sheet 310 provided therebetween in the film-shaped capacitor 300. As a result, the conductor layers 312 and 314 make up a first capacitor. The conductor layers 313 and 314 are opposed to each other with the dielectric sheet 310 provided therebetween. As a result, the conductor layers 313 and 314 make up a second capacitor. In this example, the first capacitor makes up the capacitor 114 in the resonance circuit 118 shown in FIG. 3, and the second capacitor makes up the capacitor 113 in the resonance circuit 118 shown in FIG. 3.

Then, a land pattern 41, conductor pattern 42, through hole 43 and conductor pattern 44 are formed on the front side 108*s* of the printed wiring board 108C of the fourth embodiment as illustrated in FIG. 11A. The conductor pattern 42 is continuously connected to the land pattern 41. The conductor pattern 44 is connected to the through hole 43. The conductor pattern 42 is connected to one end portion of the push switch 111 which is connected to the capacitor 113. Further, the conductor pattern 44 is connected to one end portion of the position indication coil 106 and to other end portion of the push switch 111.

Then, a notched groove 45 having a predetermined length is formed along the width (short sides) of the printed wiring board 108C between the land pattern 41 and through hole 43 in the end portion 108*e* of the printed wiring board 108C. Then, a conductor pattern 46 is formed from part of the notched groove 45. The conductor pattern 46 is connected to the other end portion of the position indication coil 106.

Further, a land pattern 47 is formed on the rear side 108*r* of the printed wiring board 108C of the fourth embodiment as illustrated in FIG. 11B. Also, a conductor pattern 48 is formed to connect the land pattern 47 and through hole 43. The land pattern 47 is formed at the position opposed to the land pattern 41 on the front side 108*s* of the printed wiring board 108C.

Then, in the fourth embodiment, the notched groove 45 of the printed wiring board 108C is brought into engagement with the notched groove 311 of the film-shaped capacitor 300 as illustrated in FIG. 12A, after which the printed wiring board 108C and the film-shaped capacitor 300 are assembled together in such a manner that the two intersect each other. In this case, the printed wiring board 108C and the film-shaped capacitor 300 are assembled together in such a manner that the conductor layers 312 and 313 come face-to-face with each other when the film-shaped capacitor 300 is bent into the form of letter U toward the end portion 108*e* of the printed wiring board 108C around the notched groove 311 at the center as illustrated in FIG. 12A.

Then, the film-shaped capacitor 300 is bent into the form of letter U toward the end portion 108*e* of the printed wiring board 108C around the notched groove 311 at the center as illustrated in FIGS. 12B and 12C, thus bringing the conductor layer 312 into contact with the land pattern 47 on the rear side 108*r* of the printed wiring board 108C and further bringing the conductor layer 313 into contact with the land pattern 41 on the front side 108*s* of the printed wiring board 108C.

Then, the portions of the film-shaped capacitor 300 sandwiching the printed wiring board 108C are crimped and sandwiched by a crimping clip 50 made of a conductive material such as conductive metal in such a manner as to maintain the conductor layer 312 in contact with the land pattern 47 on the rear side 108*r* of the printed wiring board 108C and the conductor layer 313 in contact with the land pattern 41 on the front side 108*s* of the printed wiring board 108C. Further, the crimping clip 50 made of a conductive metal is soldered to the conductor pattern 46 by a solder 49 for electrical connection.

In this case, the conductor layer 312 may be bonded in advance to the land pattern 47 on the rear side 108*r* of the printed wiring board 108C with a conductive adhesive, and the conductor layer 313 to the land pattern 41 on the front side 108*s* of the printed wiring board 108C with a conductive adhesive.

As described above, as a result of the attachment of the film-shaped capacitor 300 to the printed wiring board 108C, the first capacitor formed with the conductor layers 312 and 314 is connected in parallel with the position indication coil 106, and the second capacitor formed with the conductor layers 313 and 314 is connected in series with the push switch 111. This series connection is connected in parallel with the position indication coil 106.

Then, with the film-shaped capacitor 300 attached to the printed wiring board 108C as illustrated in FIGS. 12A to 12C, the end portions, of the longitudinal half regions where the conductor layers 312 and 313 are formed, on the side opposite to the notched groove 311 serve as free ends.

Therefore, it is possible to change the capacitance of the first capacitor made up of the conductor layers 312 and 314 with the dielectric sheet 310 provided therebetween by cutting the portion serving as a free end in directions orthogonal to the longitudinal direction as shown by dotted cutting lines 16*a* and 16*b* in FIG. 12A. This allows to adjust the resonance frequency of the resonance circuit 118 to a desired one when the push switch 111 is off.

Further, it is possible to change the capacitance of the second capacitor made up of the conductor layers 313 and 314 with the dielectric sheet 310 provided therebetween by cutting the portion serving as a free end in directions orthogonal to the longitudinal direction as shown by dotted cutting lines 17*a* and 17*b* in FIG. 12A. This allows to adjust the resonance frequency of the resonance circuit 118 to a desired one when the push switch 111 is on.

It should be noted that although, in the film-shaped capacitor 300 according to the fourth embodiment, the conductor layer 314 on the other side 310*b* of the dielectric sheet 310 is provided over the entire surface of the other side 310*b*, the conductor layer 314 may be separated into two parts, one opposed to the conductor layer 312 and another opposed to the conductor layer 313.

Fifth Embodiment: FIGS. 13A to 14B

A fifth embodiment allows to adjust the resonance frequency of the resonance circuit 118 using a film-shaped capacitor not only when the push switch 111 is off but also when it is on as does the fourth embodiment.

It should be noted that although, in the fourth embodiment, the notched grooves 311 and 45 are formed respectively in the film-shaped capacitor 300 and printed wiring board 108B, the fifth embodiment which will be described below eliminates the need to form the notched grooves 311 and 45. Further, although a crimping clip is used to dispose the film-shaped capacitor on the printed wiring board in the fourth embodiment, the fifth embodiment allows to dispose a film-shaped capacitor on a printed wiring board simply by soldering, thus eliminating the need to use any crimping clip.

Figure 13A:
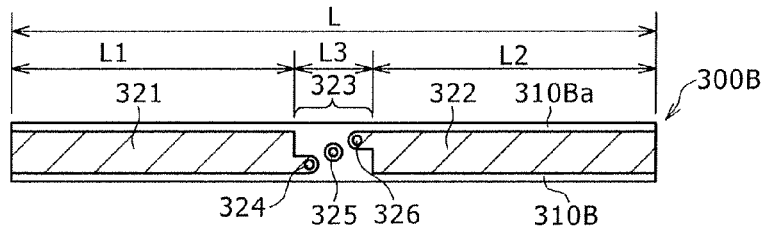
FIGS. 13A to 13C are diagrams for describing a configuration example of the film-shaped capacitor used in a fifth embodiment of the position indicator according to the present invention.
Figure 13B:
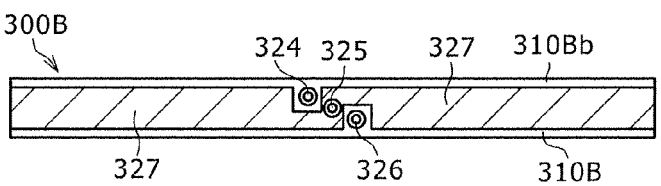
Figure 13C:
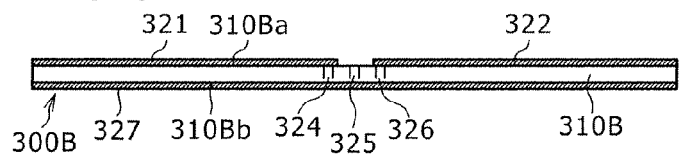

FIGS. 13A to 13C illustrate a configuration example of a film-shaped capacitor 300B in the fifth embodiment. FIG. 13A illustrates one side 310B*a* of a long, narrow and rectangular dielectric sheet 310B of the film-shaped capacitor 300B in the fifth embodiment. FIG. 13B illustrates other side 310Bb opposite to the one side 310Ba of the long, narrow and rectangular dielectric sheet 310B. FIG. 13C is a schematic side view illustrating the film-shaped capacitor 300B of the fifth embodiment in an enlarged scale along the thickness thereof.

The dielectric sheet 310B of the film-shaped capacitor 300B in the fifth embodiment is in the shape of a belt having, for example, a thickness of 12 to 25 μm, a width of 2 to 3 mm and the longitudinal length L of 35 mm.

As illustrated in FIG. 13A, in the film-shaped capacitor 300B according to the fifth embodiment, first and second conductor layers 321 and 322 are formed on the one side 310Ba of the long, narrow and rectangular dielectric sheet 310B in the longitudinal direction thereof with a vacant space 212 provided therebetween.

In this example, a longitudinal length L1 of the first conductor layer 321 is, for example, 15 mm. Further, a longitudinal length L2 of the second conductor layer 322 is, for example, 15 mm. Still further, the longitudinal length of the vacant space 323 is 5 mm.

In this example, three through holes 324, 325 and 326 that are not electrically connected to each other are formed in the vacant space 323. In this example, the through holes 324 to 326 are formed in line with each other in a diagonal direction intersecting the longitudinal direction. That is, the through hole 325 is formed at the center along the width of the dielectric sheet 310B. The through hole 324 is formed on one side along the width of the dielectric sheet 310B. The through hole 326 is formed on the other side along the width of the dielectric sheet 310B. Then, these holes 324 to 326 are arranged to be spaced from each other in such a manner as to remain electrically disconnected from each other when they are soldered to the printed wiring board.

The vacant space 323 is devoid of the first and second conductor layers 321 and 322 on the one side 310Ba of the dielectric sheet 310B. It should be noted, however, that, in this example, a narrow conductor layer is extended from the first conductor layer 321 to the through hole 324 out of all the three through holes 324 to 326 in such a manner that the first conductor layer 321 is electrically connected to the through hole 324, i.e., the one closest to the first conductor layer 321, as illustrated in FIGS. 13A and 13C.

Further, a narrow conductor layer is extended from the second conductor layer 322 to the through hole 326 out of all the three through holes 324 to 326 in such a manner that the second conductor layer 322 is electrically connected to the through hole 326, i.e., the one closest to the second conductor layer 322.

On the other hand, a third conductor layer 327 is formed on the other side 310Bb of the dielectric sheet 310B in the longitudinal direction thereof in such a manner as to include a space opposed to the vacant space 323 on the one side 310Ba of the dielectric sheet 310B. It should be noted, however, that the third conductor layer 327 is formed in the shape of a hook so as not to be connected to the through hole 324 or 326 but only to the through hole 325 at the center in the space opposed to the vacant space 323 on the one side 310Ba of the dielectric sheet 310B, as shown in FIG. 13B.

It should be noted that, in the fifth embodiment, each of the conductor layers 321, 322 and 327 is formed at a predetermined distance (distance d1 as described above) inward from the edge of the dielectric sheet 310B along the width thereof rather than being formed to the edge thereof as in the above embodiments as a countermeasure against humidity to prevent a significant change in the capacitance of the film-shaped capacitor 300B due to the adhesion of water droplets described above.

As described above, the first to third conductor layers 321, 322 and 327 are formed on both sides of the dielectric sheet 310B. In the film-shaped capacitor 300B according to the fifth embodiment, therefore, the first and third conductor layers 321 and 327 are opposed to each other with the dielectric sheet 310B provided therebetween, thus making up a first capacitor. Then, the through holes 324 and 325 are used respectively as one and other electrodes of the first capacitor.

Further, in the film-shaped capacitor 300B according to the fifth embodiment, therefore, the second and third conductor layers 322 and 327 are opposed to each other with the dielectric sheet 310B provided therebetween, thus making up a second capacitor. Then, the through holes 326 and 325 are used respectively as one and other electrodes of the second capacitor.

This makes it possible to connect the first and second capacitors to the position indication coil 106 in a desired manner simply by connecting the three through holes 324 to 326 to the conductor patterns of the printed wiring board 108.

Figure 14A:
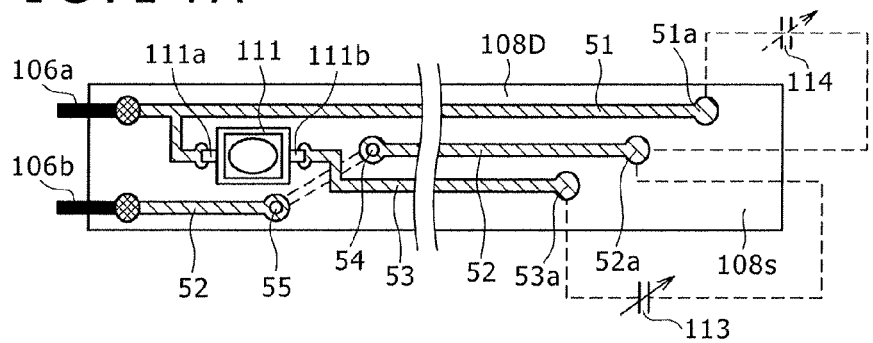
FIGS. 14A and 14B are diagrams for describing main components of the fifth embodiment of the position indicator according to the present invention.
Figure 14B:
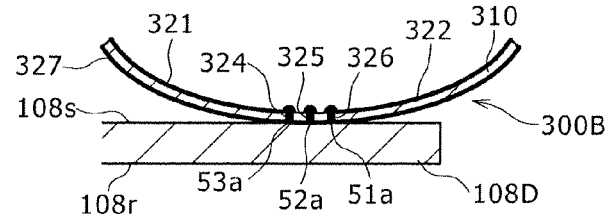

FIGS. 14A and 14B illustrate diagrams for describing an example of attachment of the film-shaped capacitor 300B in the fifth embodiment to a printed wiring board 108D. FIG. 14A is a diagram illustrating an example of conductor pattern on the printed wiring board 108D together with an example of arrangement of the push switch 111 in this example. Further, FIG. 14B is a diagram for describing the manner in which the film-shaped capacitor 300B is attached to the printed wiring board 108D in the fifth embodiment.

In the example shown in FIGS. 14A and 14B, the first capacitor made up of the first and third conductor layers 321 and 327 is used as the capacitor 113 to adjust the resonance frequency of the resonance circuit when the push switch 111 is on, and the second capacitor made up of the second and third conductor layers 322 and 327 is used as the trimmer capacitor 114 to adjust the resonance frequency of the resonance circuit when the push switch 111 is off as illustrated by dotted lines in FIG. 14A.

As illustrated in FIG. 14A, first, second and third conductor patterns 51, 52 and 53 are formed on the front side 108s of the printed wiring board 108D in this example.

A land pattern 51a to which the through hole 326 of the film-shaped capacitor 300B is to be connected by soldering is formed on one end portion of the first conductor pattern 51. Further, a land pattern 52a to which the through hole 325 of the film-shaped capacitor 300B is to be connected by soldering is formed on one end portion of the second conductor pattern 52. Still further, a land pattern 53a to which the through hole 324 of the film-shaped capacitor 300B is to be connected by soldering is formed on one end portion of the third conductor pattern 53.

Then, as illustrated in FIG. 14A, in the printed wiring board 108D in this example, one end 106a of the position indication coil 106 is, for example, soldered to other end portion of the first conductor pattern 51 for electrical connection. Further, other end 106b of the position indication coil 106 is, for example, soldered to other end portion of the second conductor pattern 52 for electrical connection.

Further, the first conductor pattern 51 is branched off halfway and connected to a land pattern to which one terminal 111a of the push switch 111 is soldered. Still further, other terminal 111b of the push switch 111 is connected to a land pattern formed on the other end portion of the third conductor pattern 53.

It should be noted that the second and third conductor patterns 52 and 53 intersect each other for convenience of routing as illustrated in FIG. 14A. In the case of this example, the second conductor pattern 52 is disposed in such a manner that part thereof runs on the rear side of the printed wiring board 108D via the through holes 54 and 55.

Then, the through hole 324 is soldered to the land pattern 53a of the third conductor pattern 53, the through hole 325 to the land pattern 52a of the second conductor pattern 52, and the through hole 326 to the land pattern 51a of the first conductor pattern 51 as illustrated in FIG. 14B, thus attaching and securing the film-shaped capacitor 300B to the printed wiring board 108D having the conductor patterns configured as described above.

As a result, as is clear from FIG. 14A, the first capacitor made up of the first and third conductor layers 321 and 327 is connected in series with the push switch 111, and the series circuit made up of the push switch 111 and the first capacitor is connected in parallel with the position indication coil 106. Further, the second capacitor made up of the second and third conductor layers 322 and 327 is connected in parallel with the position indication coil 106.

Then, the longitudinal free end side of the film-shaped capacitor 300B is cut, for example, with scissors as in the embodiments described earlier, thus changing the capacitance of each of the first capacitor made up of the first and third conductor layers 321 and 327 and the second capacitor made up of the second and third conductor layers 322 and 327 for adjustment.

As described above, in the fifth embodiment, the film-shaped capacitor 300B can be attached to the printed wiring board 108D simply by soldering. This eliminates the need to provide notched grooves in the printed wiring board and film-shaped capacitor as in the fourth embodiment. Further, there is no need to use a crimping clip as in the fourth embodiment.

Still further, in the fifth embodiment, the three through holes 324, 325 and 326 are formed diagonally with respect to the longitudinal direction of the film-shaped capacitor 300B as described earlier. Therefore, the film-shaped capacitor 300B is secured to the printed wiring board 108D at three points along the width thereof, thus providing firmer securing than if the three through holes are arranged in line with each other in the longitudinal direction.

It should be noted that the position indicator has the push switch 111 in the fifth embodiment, and the first capacitor made up of the first and third conductor layers 321 and 327 and the second capacitor made up of the second and third conductor layers 322 and 327 are used to adjust the resonance frequency of the resonance circuit respectively when the push switch 111 is on and when it is off.

However, some position indicators do not have any push switch. In this case, one capacitor is enough to adjust the resonance frequency of the resonance circuit. The film-shaped capacitor 300B according to the fifth embodiment is naturally applicable to such a position indicator with no push switch.

That is, in the case of a position indicator with no push switch, only one of the first and second capacitors of the film-shaped capacitor 300B can be cut along its length for adjusting resonance frequency. Then, the other of the first and second capacitors of the film-shaped capacitor 300B is used as part of a plurality of chip capacitors adapted to determine the rough resonance frequency of the resonance circuit of the position indicator. In this case, therefore, the longitudinal length of the other of the first and second capacitors of the film-shaped capacitor 300B is selected to be appropriate for use as the chip capacitors.

It should be noted that, needless to say, other chip capacitors are not necessary if only the other of the first and second capacitors of the film-shaped capacitor 300B is sufficient in terms of capacitance to specify the resonance frequency of the parallel resonance circuit with the position indication coil.

It should be noted that, needless to say, the film-shaped capacitor according to the fourth embodiment is applicable to a position indicator with no push switch as with the case of the fifth embodiment.

Other Embodiments and Modification Examples

Each of the position indicators according to the above embodiments receives signal energy from the position detector with a resonance circuit through electromagnetic induction and transmits the energy accumulated in the resonance circuit to the position detector. However, the present invention can also be used to specify circuit constants of the position indicator that has a signal transmission circuit and transmits a signal to the position detector.

Further, the above embodiments are configuration examples in which an electromagnetic induction position indicator is used. However, the present invention is not limited to a position indicator but is applicable to an electronic circuit such as time constant circuit or resonance circuit including a capacitor. Still further, the present invention can be used not only to adjust the resonance frequency of a resonance circuit and the time constant of a time constant circuit but also to specify a variety of constants of an electronic circuit that can be adjusted with the capacitance of capacitors.

Still further, the film-shaped capacitor has a capacitor in the first to third embodiments and two capacitors, i.e., first and second capacitors, in the fourth and fifth embodiments. However, the film-shaped capacitor used in the present invention may naturally have three or more capacitors. In particular, it is preferred that the film-shaped capacitor should have three or more capacitors if the film-shaped capacitor is used in an electronic circuit for which it is necessary to specify a plurality of constants such as time constant and resonance frequency.

Figure 15A:
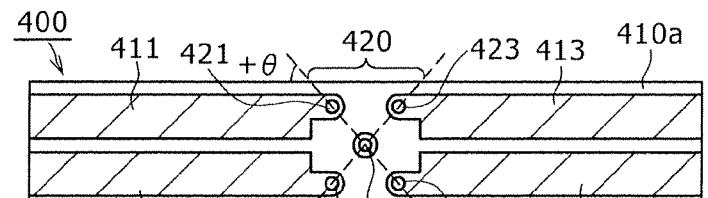
FIGS. 15A to 15D are diagrams for describing a configuration example of the film-shaped capacitor used in an electronic circuit or a position indicator according to various embodiments of the present invention.
Figure 15B:
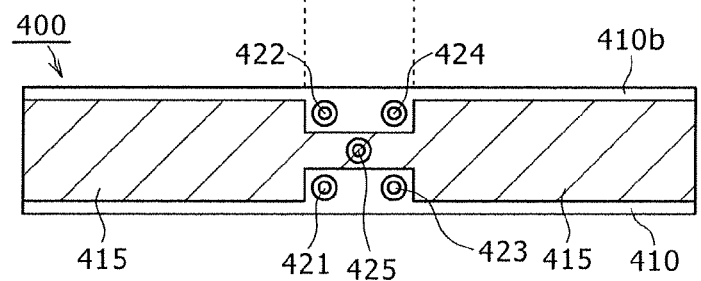
Figure 15C:
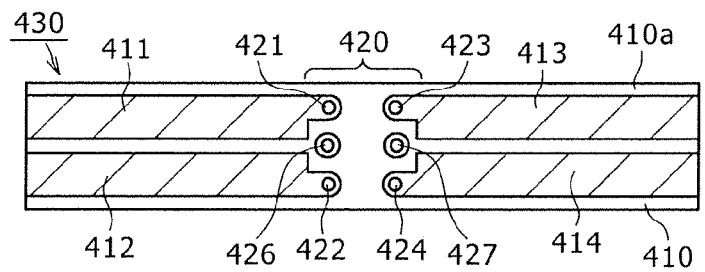
Figure 15D:
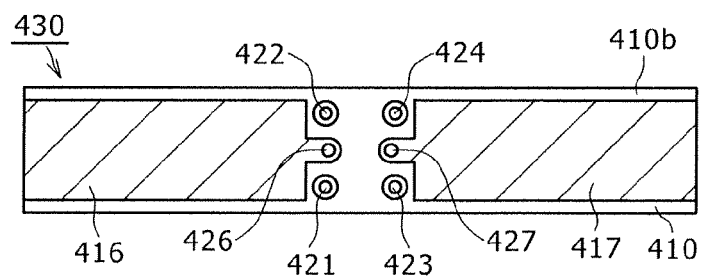

FIGS. 15A to 15D illustrate configuration examples of film-shaped capacitors having four or more capacitors. FIGS. 15A and 15B illustrate a first example of such a film-shaped capacitor. FIGS. 15C and 15D illustrate a second example of such a film-shaped capacitor. It should be noted that the first and second examples are modification examples of the film-shaped capacitor 300B used in the fifth embodiment described above.

A description will be given first of a film-shaped capacitor 400 of the first example shown in FIGS. 15A and 15B. FIG. 15A illustrates one side 410a of a long, narrow and rectangular dielectric sheet 410 of the film-shaped capacitor 400 of the first example. FIG. 15B illustrates a side 410b opposite to the one side 410a of the dielectric sheet 410.

The dielectric sheet 410 of the film-shaped capacitor 400 in the first example is also in the shape of a belt having, for example, a thickness of 12 to 25 μm, a width of 2 to 3 mm and the longitudinal length L of 35 mm.

As illustrated in FIG. 15A, in the film-shaped capacitor 400 of the first example, first and second conductor layers 411 and 412 are formed in one of two regions with a vacant space 420 provided therebetween on the one side 410a of the dielectric sheet 410, and third and fourth conductor layers 413 and 414 in the other of the two regions. The vacant space 420 is provided roughly at the longitudinal center of the dielectric sheet 410.

In this example, the first and second conductor layers 411 and 412 are formed to be parallel to each other in two regions into which the region along the width of the dielectric sheet 410 is divided, one in each region. Similarly, the third and fourth conductor layers 413 and 414 are formed to be parallel to each other in two regions into which the region along the width of the dielectric sheet 410 is divided, one in each region. In the first example, the conductor layers are equal in longitudinal length and width.

In the first example, five through holes 421 to 425 that are electrically disconnected from each other are formed in the vacant space 420. In this example, the through hole 425 is formed at the center of the vacant space 420 of the dielectric sheet 410. Then, the through holes 421 and 424 are formed in such a manner that the through holes 421, 425 and 424 are arranged side by side in this order in line with each other in a diagonal direction intersecting the longitudinal direction at a predetermined angle +θ. In addition, the through holes 422 and 423 are formed in such a manner that the through holes 422, 425 and 423 are arranged side by side in this order in line with each other in a diagonal direction intersecting the longitudinal direction at a predetermined angle −θ.

Therefore, the through holes 421 and 422 are formed each at one end along the width of the dielectric sheet 410. Similarly, the through holes 423 and 424 are formed each at one end along the width of the dielectric sheet 410. Then, the through holes 421 to 425 are spaced from each other in such a manner as to be electrically disconnected from each other when they are soldered to the printed wiring board.

In the vacant space 420, the conductor layers 411 to 414 are not formed on the one side 410a of the dielectric sheet 410. It should be noted, however, that, in this example, a narrow conductor layer is extended from the first conductor layer 411 to the through hole 421 in such a manner that the first conductor layer 411 is electrically connected to the through hole 421 as illustrated in FIG. 15A. Further, a narrow conductor layer is extended from the second conductor layer 412 to the through hole 422 in such a manner that the second conductor layer 412 is electrically connected to the through hole 422.

Still further, a narrow conductor layer is extended from the third conductor layer 413 to the through hole 423 in such a manner that the third conductor layer 413 is electrically connected to the through hole 423. Still further, a narrow conductor layer is extended from the fourth conductor layer 414 to the through hole 424 in such a manner that the fourth conductor layer 414 is electrically connected to the through hole 424.

On the other hand, a fifth conductor layer 415 is formed on the other side 410b of the dielectric sheet 410 in the longitudinal direction thereof in such a manner as to include a space opposed to the vacant space 420 on the one side 410a of the dielectric sheet 410. It should be noted, however, that the fifth conductor layer 415 is formed in the shape of a narrow pattern so that it is not connected to the through holes 421 to 424 but only to the through hole 425 at the center in the space opposed to the vacant space 420 on the one side 410a of the dielectric sheet 410, as shown in FIG. 15B.

It should be noted that, in the first example, each of the first to fifth conductor layers 411 to 415 is formed at a predetermined distance (distance d1 described above) inward from the edge of the dielectric sheet 410 along the width thereof rather than being formed to the edge thereof as in the above embodiments as a countermeasure against humidity to prevent a significant change in the capacitance of the film-shaped capacitor 400 due to the adhesion of water droplets described above.

Because the first to fifth conductor layers 411 to 415 are formed on both sides of the dielectric sheet 410 as described above, each of the first to fourth conductor layers 411 to 414 and the fifth conductor layer 415 are opposed to each other with the dielectric sheet 410 therebetween in the film-shaped capacitor 400 of the first example, thus making up four capacitors, i.e., first to fourth capacitors. Then, the through hole 425 can be used, for example, as a common other electrode of the first to fourth capacitors, and each of the through holes 421 to 424 as one electrode of one of the first to fourth capacitors.

Then, in the first example, predetermined conductor patterns are formed for connection to the first to fourth capacitors of the electronic circuit formed on the printed wiring board. Further, each of the five through holes 421 to 425 is connected and secured by soldering to a corresponding conductor pattern on the printed wiring board as in the fifth embodiment. This allows to connect the first to fourth capacitors of the electronic circuit in a desired manner for use as a capacitor adapted to adjust the capacitance.

A description will be given next of a film-shaped capacitor 430 of the second example shown in FIGS. 15C and 15D. The film-shaped capacitor 430 of the second example is a modification example of the film-shaped capacitor 400 of the first example. In the second example, the same components as those of the first example are denoted by the same reference numerals.

FIG. 15C illustrates the one side 410a of the long, narrow and rectangular dielectric sheet 410 of the film-shaped capacitor 430 of the second example. FIG. 15D illustrates the side 410b opposite to the one side 410a of the dielectric sheet 410.

In the film-shaped capacitor 430 of the second example, the through holes 421 to 424 are formed in the vacant space 420 in the same manner as in the first example. However, the through hole 425 at the center is not formed. Instead, a through hole 426 is formed between the through holes 421 and 422 in such a manner as to be arranged side by side in line with each other along the width. Further, a through hole 427 is formed between the through holes 423 and 424 in such a manner as to be arranged side by side in line with each other along the width.

Then, in the film-shaped capacitor 430 of the second example, each of the first to fourth conductor layers 411 to 414 is formed on the one side 410a of the dielectric sheet 410 as illustrated in FIG. 15C in the same manner as in the first example. Further, these conductor layers 411 to 414 are connected respectively to the through holes 421 to 424.

In the film-shaped capacitor 400 of the first example described above, the common single fifth conductor layer 415 is formed on the side 410b opposite to the one side 410a of the dielectric sheet 410 for the first to fourth conductor layers 411 to 414. Further, the fifth conductor layer 415 is connected to the through hole 425.

In contrast, on the side 410b opposite to the one side 410a of the dielectric sheet 410 of the film-shaped capacitor 430 of the second example, sixth and seventh conductor layers 416 and 417 are formed rather than forming the fifth conductor layer 415 of the first example. The sixth conductor layer 416 is opposed to the first and second conductor layers 411 and 412 with the dielectric sheet 410 provided therebetween. The seventh conductor layer 417 is opposed to the third and fourth conductor layers 413 and 414 with the dielectric sheet 410 provided therebetween.

Then, the sixth conductor layer 416 is extended to connect to the through hole 426. Further, the seventh conductor layer 417 is extended to connect to the through hole 427.

In the film-shaped capacitor 430 of the second example illustrated in FIGS. 15C and 15D, each of the first and second conductor layers 411 and 412 is opposed to the sixth conductor layer 416 with the dielectric sheet 410 provided therebetween, thus making up the first and second capacitors. Further, each of the third and fourth conductor layers 413 and 414 is opposed to the seventh conductor layer 417 with the dielectric sheet 410 provided therebetween, thus making up the third and fourth capacitors. Then, the through holes 426 and 427 are provided, and the sixth and seventh conductor layers 416 and 417 are disconnected from each other. This provides an advantage in that the film-shaped capacitor 430 of the second example can use the first and second capacitors and the third and fourth capacitors as separate circuits.

It should be noted that although, in the first and second examples shown in FIGS. 15A to 15D, the vacant space 420 is provided at the longitudinal center of the dielectric sheet 410, needless to say, the vacant space 420 is located more toward one longitudinal side of the dielectric sheet 410 depending on the difference in capacitance between the first and second capacitors and the third and fourth capacitors. Further, the first and second conductor layers 411 and 412 or the third and fourth conductor layers 413 and 414 formed to be separate from each other along the width of the dielectric sheet 410 are equal in longitudinal length and width. However, these layers may have different longitudinal lengths and widths to match the necessary capacitances.

Alternatively, although, in the examples shown in FIGS. 15A to 15D, two conductor layers each are provided along the width of the dielectric sheet, three conductor layers each may be provided along the width thereof with a through hole provided for each of these conductor layers. Still alternatively, although, in the above example, a plurality of capacitors are formed on the film-shaped capacitor, only two through holes are enough for the film-shaped capacitor according to the first embodiment.

It should be understood by those skilled in the art that various modifications, combinations, sub-combinations and alterations may occur depending on design requirements and other factors insofar as they are within the scope of the appended claims or the equivalents thereof.

What is claimed is:

1. A position indicator comprising:
an enclosure forming a hollow and rod-shaped tubular body;
a substrate disposed in the hollow portion of the enclosure and having a circuit configured to process signals exchanged with a position detection sensor; and
a film-shaped capacitor having first and second conductor layers, the first conductor layer being formed on one side of a sheet-shaped dielectric, the second conductor layer being formed on another side of the sheet-shaped dielectric and being opposed to the first conductor layer with the sheet-shaped dielectric provided therebetween, wherein
the film-shaped capacitor is fastened to the substrate in such a manner as to make up part of said circuit, and the size of an area over which the first and second conductor layers of the film-shaped capacitor are opposed to each other is changeable by changing the size of the film-shaped capacitor so as to specify a constant of said circuit disposed on the substrate, and
the film-shaped capacitor is fastened to the substrate in such a manner that at least one of longitudinal end portions of the film-shaped capacitor is left free.

2. The position indicator of claim 1, wherein
the circuit includes a resonance circuit made up of an inductance element and a capacitor, and wherein
the film-shaped capacitor makes up part of the capacitor making up the resonance circuit, and the size of the area over which the first and second conductor layers of the film-shaped capacitor are opposed to each other is changeable by changing the size of the film-shaped capacitor so as to specify a characteristic of the resonance circuit.

3. The position indicator of claim 1, wherein
at least one of the first and second conductor layers of the film-shaped capacitor is formed inward at least from the longitudinal edge of the sheet-shaped dielectric.

4. The position indicator of claim 1, wherein the size of the area over which the first and second conductor layers of the film-shaped capacitor are opposed to each other with the sheet-shaped dielectric provided therebetween is changeable by cutting the free end.

5. The position indicator of claim 1, wherein
the substrate has a plate-shaped body whose longitudinal direction runs along the center line of a tubular body making up the enclosure, and wherein
one longitudinal end of the film-shaped capacitor is fastened to the substrate having the plate-shaped body, and another longitudinal end of the film-shaped capacitor is left free.

6. The position indicator of claim 1, wherein
the first conductor layer of the film-shaped capacitor is electrically connected to a first conductor pattern formed on one side of the substrate via a conductive adhesive, and wherein
the second conductor layer of the film-shaped capacitor is electrically connected to a second conductor pattern formed on said one side of the substrate by wire bonding.

7. The position indicator of claim 1, wherein
the first conductor layer of the film-shaped capacitor is electrically connected to a first conductor pattern formed on one side of the substrate, and wherein
the second conductor layer is electrically connected to a second conductor pattern formed on another side of the substrate.

8. The position indicator of claim 7, wherein
the film-shaped capacitor is fastened to the substrate by crimping and sandwiching, by a conductive clip member, the one and the another sides of the substrate in such a manner as to establish an electrically connecting interface between the first conductor layer of the film-shaped capacitor and the first conductor pattern of the substrate, and wherein
the conductive clip member is electrically connected to the second conductor pattern of the substrate so as to electrically connect the second conductor layer of the film-shaped capacitor to the second conductor pattern of the substrate.

9. The position indicator of claim 7, wherein
a notched portion intersecting the longitudinal direction is formed in at least one of the substrate and the film-shaped capacitor, and wherein
the film-shaped capacitor and the substrate are assembled in such a manner as to intersect each other at the notched portion, and the first conductor layer of the film-shaped capacitor is bonded to the first conductor pattern of the substrate with a conductive adhesive for electrical connection, and the second conductor layer of the film-shaped capacitor is bonded to the second conductor pattern of the substrate with a conductive adhesive for electrical connection.

10. The position indicator of claim 1, wherein
the first conductor layer and a third conductor layer disconnected from the first conductor layer are formed on said one side of the sheet-shaped dielectric of the film-shaped capacitor, and the second conductor layer on said another side of the sheet-shaped dielectric is formed in such a manner as to be opposed to the first and third conductor layers, wherein the film-shaped capacitor has a first capacitor made up of the first and second conductor layers and a second capacitor made up of the second and third conductor layers, and wherein the size of the area over which the first and second conductor layers are opposed to each other and the size of an area over which the second and third conductor layers are opposed to each other are independently changeable by cutting the film-shaped capacitor, and a first constant of said circuit disposed on the substrate is specified by changing the size of the area over which the first and second conductor layers are opposed to each other, and a second constant of said circuit disposed on the substrate is specified by changing the size of the area over which the second and third conductor layers are opposed to each other.

11. The position indicator of claim 10, wherein the first and third conductor layers are formed to be separate from each other in the longitudinal direction of the film-shaped capacitor, and the film-shaped capacitor is fastened to the substrate where the first and third conductor layers are separated, and both of the longitudinal end portions of the film-shaped capacitor are left free.

12. The position indicator of claim 11, wherein two through holes are provided at the longitudinal end portions of the sheet-shaped dielectric of the film-shaped capacitor, and the two through holes are connected respectively to the first and second conductor layers, and wherein the film-shaped capacitor is fastened to the substrate by soldering the two through holes to the substrate.

13. The position indicator of claim 11, wherein three through holes are provided in a region separating the first and third conductor layers in the longitudinal direction of the sheet-shaped dielectric of the film-shaped capacitor, and the three through holes are connected respectively to the first, second and third conductor layers, and wherein the film-shaped capacitor is fastened to the substrate by soldering the three through holes to the substrate.

14. The position indicator of claim 1, wherein the first conductor layer and a third conductor layer disconnected from the first conductor layer are formed on said one side of the sheet-shaped dielectric of the film-shaped capacitor, and a fourth conductor layer, disconnected from the second conductor layer that is opposed to the first conductor layer, is formed on said another side of the sheet-shaped dielectric in such a manner as to be opposed to the third conductor layer, wherein the film-shaped capacitor has a first capacitor made up of the first and second conductor layers and a second capacitor made up of the third and fourth conductor layers, and wherein the size of the area over which the first and second conductor layers are opposed to each other and the size of an area over which the third and fourth conductor layers are opposed to each other are independently changeable by cutting the film-shaped capacitor, and a first constant of said circuit disposed on the substrate is specified by changing the size of the area over which the first and second conductor layers are opposed to each other, and a second constant of said circuit disposed on the substrate is specified by changing the size of the area over which the third and fourth conductor layers are opposed to each other.

15. The position indicator of claim 14, wherein the first and third conductor layers are formed to be separate from each other in the longitudinal direction of the film-shaped capacitor, and the film-shaped capacitor is fastened to the substrate where the first and third conductor layers are separated, and both of the longitudinal end portions of the film-shaped capacitor are left free.

16. The position indicator of claim 15, wherein two through holes are provided at the longitudinal end portions of the sheet-shaped dielectric of the film-shaped capacitor, and the two through holes are connected respectively to the first and second conductor layers, and wherein the film-shaped capacitor is fastened to the substrate by soldering the two through holes to the substrate.

17. The position indicator of claim 15, wherein three through holes are provided in a region separating the first and third conductor layers in the longitudinal direction of the sheet-shaped dielectric of the film-shaped capacitor, and the three through holes are connected respectively to the first, second and third conductor layers, and wherein the film-shaped capacitor is fastened to the substrate by soldering the three through holes to the substrate.

18. An electronic circuit comprising:

a substrate on which a circuit is disposed; and a film-shaped capacitor having a first conductor layer formed on one side of a sheet-shaped dielectric and a second conductor layer on another side of the sheet-shaped dielectric opposite from said one side, the second conductor layer being opposed to the first conductor layer with the sheet-shaped dielectric provided therebetween, wherein the film-shaped capacitor is fastened to and disposed on the substrate so as to make up part of said circuit, and the size of an area over which the first and second conductor layers of the film-shaped capacitor are opposed to each other is changeable by changing the size of the film-shaped capacitor so as to specify a constant of said circuit disposed on the substrate, and the film-shaped capacitor is fastened to the substrate in such a manner that at least one of longitudinal end portions of the film-shaped capacitor is left free.

19. The electronic circuit of claim 18, wherein a plurality of conductor layers are provided on said one side of the sheet-shaped dielectric, and one or a plurality of conductor layers are provided on said another side of the sheet-shaped dielectric, wherein through holes are provided one for each of the plurality of conductor layers at a longitudinal intermediate portion of the sheet-shaped dielectric, and wherein the substrate on which the circuit is disposed has land portions at positions matching those of the through holes, and the film-shaped capacitor forms part of said circuit by fastening the through holes and the land portions by soldering.

* * * * *